US006106609A

United States Patent [19]

Yang et al.

[11] Patent Number: 6,106,609

[45] **Date of Patent: *Aug. 22, 2000**

[54] FORMATION OF NANOCRYSTALLINE SEMICONDUCTOR PARTICLES WITHIN A BICONTINUOUS CUBIC PHASE

[75] Inventors: Jianping Yang, Alexandria; Banahalli R. Ratna, Springfield, both of Va.

[73] Assignee: The United States of America as represented by the Secretary of the Navy, Washington, D.C.

[ * ] Notice: This patent is subject to a terminal disclaimer.

[21] Appl. No.: 08/841,957

[22] Filed: Apr. 8, 1997

[51] Int. Cl.[7] .............................. C30B 7/00; H01L 21/00

[52] U.S. Cl. .................................. 117/11; 117/68; 438/63

[58] Field of Search .......................... 117/11, 68; 427/64, 427/157, 215; 252/301.6 R, 301.6 S, 301.4 S, 301.4 F, 501.1; 430/88, 90, 94, 95, 135; 257/102, 103; 428/323, 402, 690; 438/34, 46, 63

[56] References Cited

U.S. PATENT DOCUMENTS

| | | | |
|---|---|---|---|
| 4,898,981 | 2/1990 | Falk et al. | 568/28 |
| 5,238,613 | 8/1993 | Anderson | 264/425 |
| 5,244,799 | 9/1993 | Anderson | 435/397 |
| 5,446,286 | 8/1995 | Bhargava | 250/361 |
| 5,525,377 | 6/1996 | Gallagher et al. | 427/512 |
| 5,531,925 | 7/1996 | Landh et al. | 252/299.01 |
| 5,585,640 | 12/1996 | Huston et al. | 250/483.1 |
| 5,882,779 | 3/1999 | Lawady | 428/323 |

OTHER PUBLICATIONS

Fontell, *Coll. Poly Sci.* 1990, 268, 264–285.

Luzzati et al., *Nature* 1967, 216, 701.

Lindblom et al., *J. Am Chem Soc.*, 1979, 101 5465.

Larsson, L., *J. Phys. Chem.* 1989, 93, 7304–7314.

Linblom et al., *Biochim. Biophys Acta* 1989, 988, 221–256.

Yang et al., *J. Phys. Chem.* 1996, vol. 100, No. 43, pp. 17255–17259.

Puvvada et al., *J. Am. Chem. Soc.* v.116 (Mar.) , p. 2135–6 (1994).

*Primary Examiner*—Benjamin L. Utech
*Assistant Examiner*—Donald L. Champagne
*Attorney, Agent, or Firm*—Barry A. Edelberg; Ralph T. Webb

[57] ABSTRACT

Nanocrystalline semiconductors are synthesized within a bicontinuous cubic matrix 10. The nanocrystalline particles 12 may then be end-capped 18 with a dispersant to prevent agglomeration. One typical nanocrystalline semiconductor compound made according to the present invention is PbS. Other IV–VI semiconductors may be produced by the method of the present invention. The method of this invention may also be used to produce doped semiconductors.

19 Claims, 5 Drawing Sheets

FORMATION OF NANOCRYSTALLINE SEMICONDUCTOR PARTICLES WITHIN A BICONTINUOUS CUBIC PHASE

BACKGROUND OF THE INVENTION

1. Field of the Invention

The present invention relates generally to the formation of semiconductor particles, and more specifically to the formation of nanocrystalline semiconductor particles.

2. Description of the Background Art

Since the earlier studies, starting in mid-1980's, various synthetic approaches have been developed in making nanosized II–VI (Zn and Cd chalcogenides) and IV–VI (Pb chalcogenides) semiconductors. Much of this effort is aimed at achieving a very narrow distribution in the size of the particles. The basic idea is to use the spatial or chemical confinement provided by matrices or organic capping molecules to terminate the growth of nanocrystallites at any desired stage. In most cases, lack of a microscopically uniform environment in the substrates might be the cause for relatively wide size distribution. Both organic and inorganic matrices, such as monolayers, polymers, inverse micelles, and zeolites have been used to control the particle size. Recently, other researchers have synthesized monodispersed CdSe nanocrystallites based on the pyrolysis of organometallic reagents. This approach uses the concept of Ostwald ripening for size selective precipitation of nanocrystallites. So far, intensive efforts have been made to synthesize quantum-sized II–VI semiconductors especially on the $CdS_xSe_{1-x}$ systems, while much fewer reports exists on IV–VI (PbE, E═S, Se, Te) compounds. Research interest in IV–VI semiconductors arises because they are small band gap materials with greater quantum-size effect and larger optical nonlinearity compared to II–VI materials.

Conventional wet chemistry synthesis performed without matrix assistance normally results in the production of micron size particles. Various host matrices, such as glass, zeolites, sol-gels, and micelles, have been used to synthesize nanoparticles. However, a number of problems are associated with these methods. The particles synthesized in glasses and sol-gels exhibit large polydispersity, since they are not ordered structures. Even though the particles formed in ordered zeolites are mostly monodispersed, the pore sizes available in zeolites are limited to below 14 Å. Another disadvantage with these methods is the inability to easily isolate the nanoparticles from the matrix material. In the case of micelles, even though it is possible to isolate the particles, large scale manufacturing becomes prohibitively expensive due to the low precursor concentrations required.

Many surfactants, when mixed with water, self-assemble into a mesoporous phase with long range three-dimensional periodicity called the Bicontinuous Cubic Phase (BCP). A wide spectrum of surfactants which can form cubic phase when mixed with water or nonaqueous solvents in binary or ternary systems can be easily found in Fontell, *Coll. Poly. Sci.* 1990, 268, 264–285, the entirety of which is incorporated herein by reference for all purposes. There have been a number of publications (Luzzati et al., *Nature* 1967, 215, 701; Lindblom et al., *J. Am Chem Soc.,* 1979, 101, 5465; Larsson, L., *J. Phys. Chem.* 1989, 93, 7304–7314; Linblom et al., *Biochim. Biophys Acta* 1989, 988, 221–256) on structure and diffusion properties of bicontinuous cubic phase of lipids and other surfactants. As defined by Lindblom et al., supra, a bicontinuous cubic phase is a "crystalline lipid/water phase . . . in which the lipid aggregates to form a three-dimensional lattice" (page 225, col. 1) and which has "regions which are continuous with respect to both polar (water) and nonpolar (hydrocarbon) components" (page 228, col. 2, emphasis added). FIG. 1 shows the Im3m structure of the bicontinuous cubic phase 10. Unlike inverse micelles which form isolated water pools encircled by lipid molecules, aqueous pores 12 in the cubic phase are interconnected with neighboring ones through small channels (not shown), with sizes ranging from 2–10 nm depending on type of surfactant and amount of water. Surfactant bilayers 18 form the exterior boundaries of aqueous pores 12. Due to the bicontinuous nature of cubic phase 10, ions can diffuse from pore to pore in the hydrophilic aqueous region without passing through the surfactant membrane barrier.

SUMMARY OF THE INVENTION

Accordingly, it is an object of this invention to produce nanocrystalline semiconductor particles.

It is another object of the present invention to produce monodispersed nanocrystalline particles.

It is a further object of the present invention to produce monodispersed nanocrystalline particles in a manner that readily allows for their isolation.

These and additional objects of the invention are accomplished by forming nanocrystalline semiconductor particles within the mesoporous cavities of a bicontinuous cubic phase. The cavities contain at least one of the reactants required to form the semiconductor compound. Any other required reactants are diffused into the mesoporous cavities. The method of the present invention may also be used to provide doped semiconductors, by diffusing dopant ions into the mesoporous cavities along with the other reactants or by including dopant ions within the mesoporous cavities of the BCP.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIG. 2(*b*) is a schematic diagram of the experimental setup used to qualitatively compare the diffusion rates of $S^{2-}$ and $Pb^{2+}$ ions.

DESCRIPTION OF THE PREFERRED EMBODIMENTS

Figure 1:
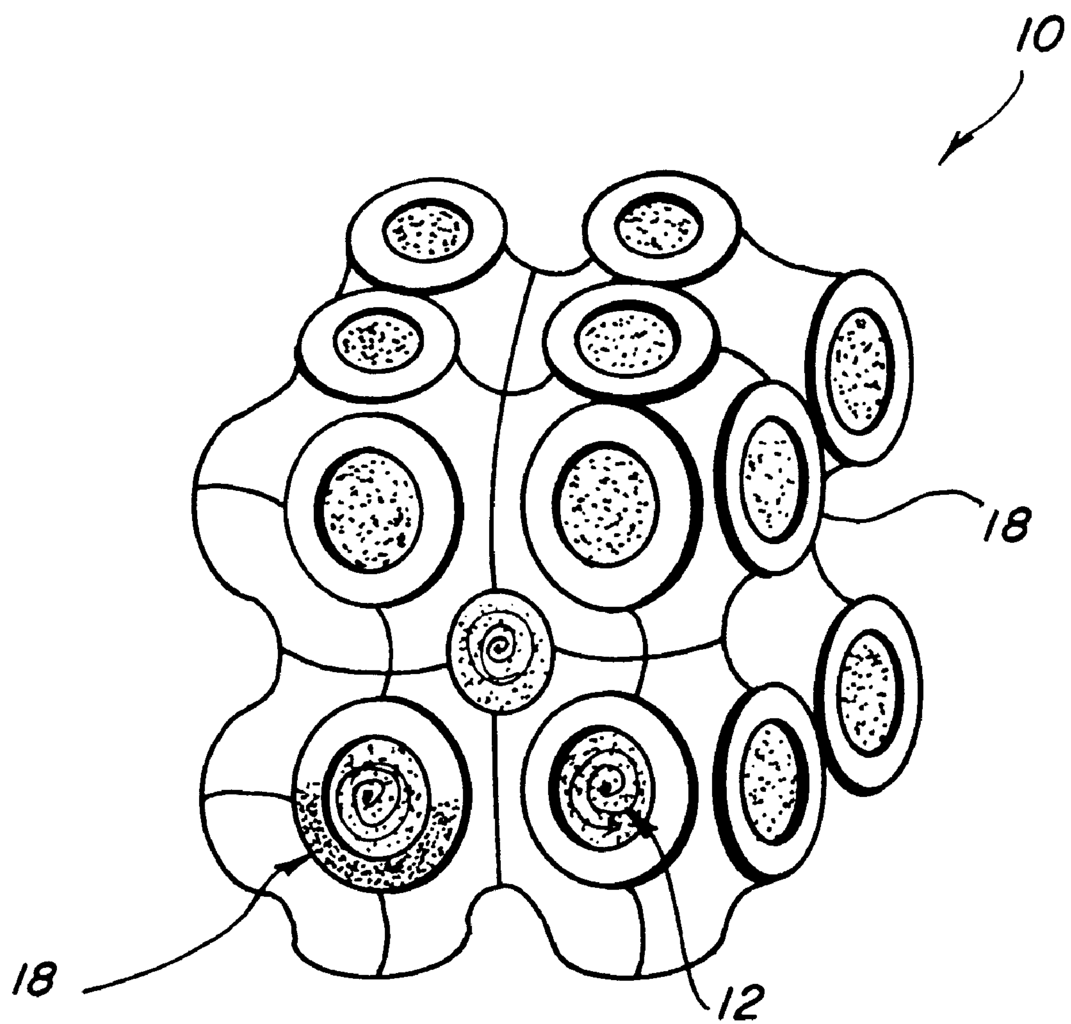
FIG. 1 shows the structure of a body-centered (Im3m) bicontinuous cubic phase.

Any combination of surfactant and aqueous phase, at any ratio that produces a bicontinuous cubic phase, may be employed. As stated earlier, the formation of bicontinuous phases has been well characterized in the prior art. Thus, the specifics of forming the bicontinuous phase will not be discussed here.

Bicontinuous cubic phases include mesoporous cavities that are interconnected by channels. In a non-inverted bicontinuous cubic phase, the hydrophobic portion of the surfactant forms interconnected cells (i.e., the surfactant membrane). The cells and the channels interconnecting the cells are filled with the aqueous phase. In an inverted bicontinuous phase, the structural roles of the aqueous and surfactant are reversed. In the specification and the claims that follow, the term "bicontinuous cubic phase" includes both non-inverted and inverted structures unless otherwise indicated. Bicontinuous phases of any structural symmetry may be used in the present invention.

The size of the mesoporous cavities in a bicontinuous cubic phase is controlled, in an art-known and recognized manner, by selection and concentrations of the aqueous phase and surfactant. Typically, mesoporous cavities (aka "pores") in a bicontinuous cubic phase have a diameter of about 2 to 10 nm. Of course, the only upper limit on the size of the mesoporous cavities useful in the method of the present invention is that they must be sufficiently small to restrict the diameter of semiconductor particles grown therein to about 100 nm or less. Therefore, bicontinuous cubic phases having mesoporous cavities as large as about 100 nm are useful according to the present invention.

Surfactants used to form the BCP structure have at least one long chain ($C_8$ or above) hydrophobic (typically alkyl) chain and at least one polar head group. These surfactants may be glycerated or non-glycerated, and may be nonionic, amphoteric, anionic, or cationic. These surfactants may also be lipids. Some typical surfactants useful in forming bicontinuous cubic phases include sodium diethyl hexylsulphosuccinate (AOT), potassium octanoate, decyltrimethylammonium chloride dodecyltrimethylammonium chloride and mono-1-olein hexadecyllysophosphatidylcholine.

The reactants used to form the semiconductor particles should be soluble in the phase (i.e., hydrophobic chain of the surfactant or the aqueous phase) which fills the pores of the bicontinuous cubic phase, and should react, in solution, to form semiconductor particles that are insoluble in the pores of the bicontinuous cubic phase.

To form semiconductor particles according to the method of the present invention, at least one of the reactants required to form the semiconductor compound, but less than all of the required reactants, are usually included in the surfactant or aqueous phase used to make the bicontinuous cubic phase, so that the later formed bicontinuous cubic phase includes that at least one reactant in solution within its pores. The remaining required reactants are then diffused into the pores of the bicontinuous cubic phase. Once these remaining materials diffuse into the pores, they react with the at least one reactant to form the desired semiconductor particles.

Alternatively, the at least one required reactant, but less than all the required reactants, are initially diffused into the pores of a preformed bicontinuous cubic phase. After this initial diffusion has completed, the remaining reactants are diffused into the pores, where they react with the reactant(s) previously diffused into the pores, thus forming semiconductor particles. Most semiconductor compounds are binary compositions, for example IV–VI semiconductors. Typically, binary semiconductors compositions are readily formed by reacting two reactants. In these cases, one of the reactants is within the pores before the other reactant is diffused into the pores. Some binary semiconductor nanocrystals that can be made according to the present invention include doped and undoped IV–VI semiconductors such as PbS, CdS, PbSe, CaS, SrS, and ZnS, as well as III–V semiconductors such as GaAs.

In another alternative, all the reactants may be placed within either the aqueous phase or the surfactant, and the temperature of the aqueous phase and/or surfactant maintained below the reaction temperature until after mixing the aqueous phase and surfactant to form the bicontinuous cubic phase.

The choice of which reactant(s) is provided in the bicontinuous cubic phase either during formation of the phase or during initial diffusion depends upon the diffusion characteristics of the reactants, and may vary depending upon the selection of the surfactant. Preferably, the reactants that diffuses slowest through bicontinuous cubic phase are the reactants initially present inside the pores. Otherwise, a substantial loss in yield may occur during diffusion of the final reactants into the bicontinuous cubic phase, since the initial reactants will be diffusion out of the pores as the final reactants are diffusing in. Persons skilled in the art can predict the diffusion characteristics of many compounds for a variety of surfactants. Thus, the selection of appropriate combinations of solvents, reactants, and surfactants to form semiconductor nanoparticles of a specified composition should not be difficult. The reactants used to form the nanocrystalline semiconductor particles according to the present invention are generally either negatively or positively charged ions that react with at least one oppositely charged ionic reactant to form the desired semiconductor compound. Dopant ions may also be provided in the matrix in the same manner as the reactants, i.e., either by diffusion or by inclusion in the solvents and/or surfactants mixed to form the bicontinuous cubic phase.

Once the reactants have formed the semiconductor compound, the bicontinuous cubic phase is dissolved in solvent that in which the semiconductor compound is insoluble. The semiconductor particles may then subjected to a final wash in a solution including an end-capping compound that serves as an antiagglomeration agent. The end capping compound is a long chain hydrocarbon Y—R—SH, where R is a hydrocarbon carbon chain of at least two, and typically three or more, carbons and Y is a hydrophobic or hydrophilic end group, depending upon the dispersing solvent (i.e., hydrophobic for non-aqueous dispersants, and hydrophilic for aqueous dispersants). Typical Y groups include alkyl groups, —COOH, —OH, —SH and

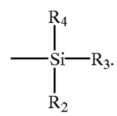

where $R_2$, $R_3$, and $R_4$ may be the same or different and are ethyl or methyl. These antiagglomeration agents attach to the surface of the particles and protect them from agglomeration and reaction with the environment, for example, air.

Semiconductor compounds end capped with end capping compounds having Y==—SH have the potential to organize into new and interesting structures. Inorganic end-capping agents, e.g., $SiO_2$ and $InO_2$, may also be used.

Of course, the reactants and materials used should maintained as free as possible of potential impurities that might significantly reduce the usefulness of the semiconductor nanocrystals produced according to the present invention as doped or undoped semiconductors.

Having described the invention, the following examples are given to illustrate specific applications of the invention including the best mode now known to perform the invention. These specific examples are not intended to limit the scope of the invention described in this application.

EXAMPLES

Example 1—Lead Sulfide Nanocrystals

Lead nitrate ($Pb(NO_3)_2$), sodium sulfide ($Na_2S$), chloroform (HPLC grade) and n-dodecanethiol were obtained from Aldrich. AOT and methanol (99.9%) were purchased from Sigma and used as received. Water was purified by B-pure system (Barnstead) providing 17 megohm-cm quality at outlet.

Figure 2A:
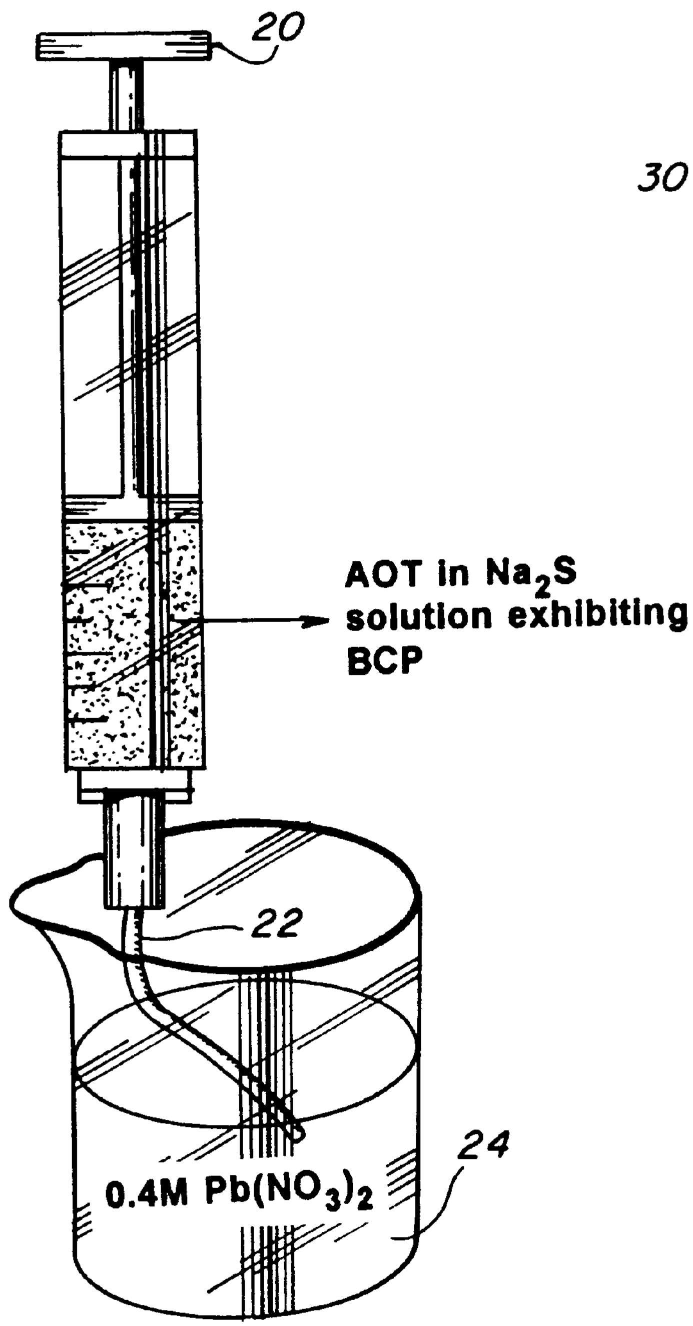
FIG. 2(*a*) is a schematic diagram of the experimental setup used to produced monodispersed, nanometer-size semiconductor particles.
Figure 2B:
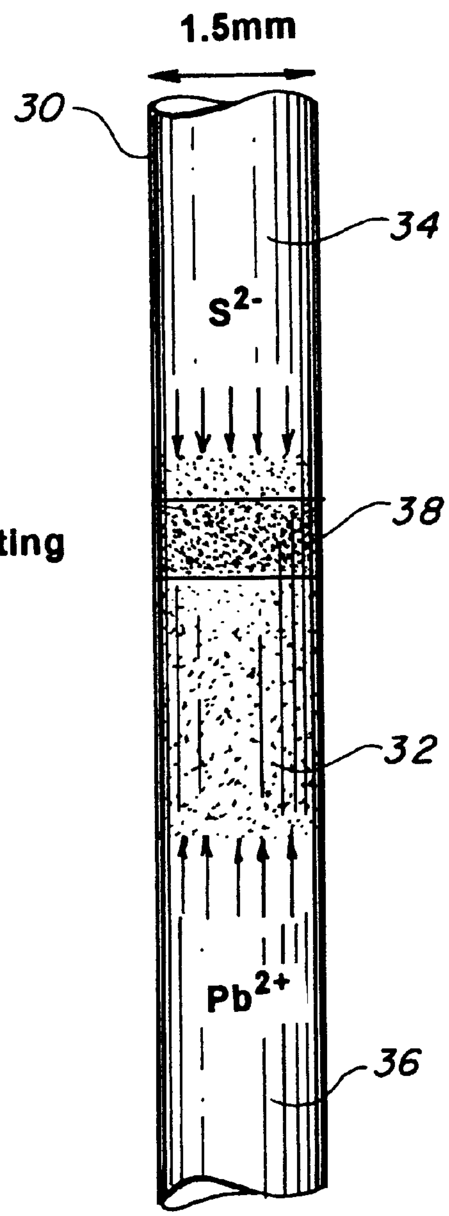
Figure 3:
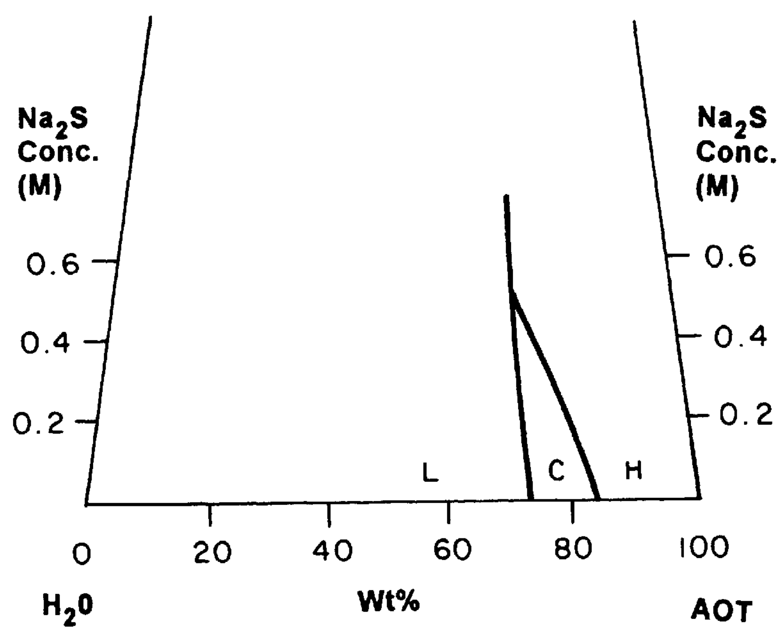
FIG. 3 is a phase diagram of the AOT (99%)/water/$Na_2S$ system. The interphase boundaries are imaginary instead of from quantitative results. L=lamellar phase, C=cubic phase, H=hexagonal phase.

The n-dodecanethiol capped nanocrystallites were synthesized typically using the following procedure. About 1.5 g mixture of aqueous $Na_2S$ solution (21.5 wt %) and AOT (78.5 wt %) was prepared in a 5 ml vial followed by centrifugation for 2 minutes at 4000 rpm. After two hours, the mixture was stirred by using a spatula until visibly uniform. After 24 hour incubation at room temperature, the mixture became transparent and extremely viscous. The presence of the cubic phase was ascertained by observing the sample under a polarized optical microscope. (BCP is optically isotropic because of its cubic symmetry and therefore appears dark between crossed polarizers. On the other hand, the lamellar and hexagonal phases which exist on either side of BCP in the phase diagram (see FIG. 3 are highly birefringent)). For $Na_2S$ solutions with higher concentrations (above 0.10 M), slightly more than 21.5% of the solution was added into AOT in order to reach cubic phase. As shown in FIG. 2(*a*), the sample in cubic phase was then filled into 5 ml disposable syringe 20 (without needles) and extruded in the shape of a cylinder 22 of 2 mm in diameter. Injection of the cylinder into aqueous 0.40 M $Pb(NO_3)_2$ solution 24 resulted in homogeneous nucleation inside the BCP. For each experiment, the sample was made using freshly prepared $Na_2S$ solution. After typically 1 hour, cylinder 22 was taken out from $Pb(NO_3)_2$ solution and washed with deionized water and then dissolved in 10 ml methanol. Centrifugation for 3 minutes at 4000 rpm led to complete precipitation of dark brown PbS powder. The colorless methanol solution was discarded by decantation. The methanol wash followed by centrifugation and decantation was repeated once again. Methanol (10 ml) and an excess n-dodecanethiol (with respect to the molar number of sulfide) were then added to the sediment followed by vigorous shaking. After 10 minutes, dark PbS powder was recovered through centrifugation and purified by washing twice with methanol. Six different PbS nanoparticulate samples were prepared by starting with aqueous $Na_2S$ solution with concentrations of 0.025, 0.050, 0.070, 0.10, 0.20 and 0.30 M, respectively. The powder was then dissolved in chloroform giving clear yellow brown or dark brown solutions depending on concentration and particle size. UV-visible absorption spectra were taken on HP8452A photodiode array spectrophotometer.

Small-angle X-ray diffraction studies of the cubic phase of AOT mixed with $Na_2S$ solutions were performed at the National Synchrotron Light Source at Brookhaven National Laboratory using 8 keV photons and a Fuji image plate system. The AOT/$Na_2S$ samples extruded from 1 ml syringe (without needle) were filled into 0.7-mm-diameter capillaries and sealed to prevent loss of water due to evaporation.

Powder X-ray diffraction spectra were collected on a Rigaku two-circle diffractometer using CuKα—radiation from a Rigaku 200 kV rotating anode X-ray generator. Sample for X-ray diffraction was prepared by drying the chloroform solution on a clean silicon wafer. The particle size of PbS samples was determined by measuring the full width at half maximum (FWHM) of the observed X-ray diffraction peaks. A diffraction scan taken for a NaCl sample of known grain size (>100 nm) was used to determine the peak broadening arising due to instrumental effects such as the divergence of the incident beam and the width of the X-ray source. As peak broadening due to particle size is only observable for grains less than 100 nm in diameter, a measurement of peak width in the larger grained standard sample allows the aforementioned effects to be segregated. Using the method described in B. D. Cullity, *Elements of X-ray Diffraction* (Addison-Wesley, Reading, Mass. (1978) p284 (the entirety of which is incorporated herein by reference for all purposes), which assumes that the diffraction line has the shape of an error curve, B the broadening of the diffraction peak arising due to particle size (radians) is given by $$B^2=B_M^2-B_S^2 \quad (1)$$

where $B_M$ is the measured FWHM from the sample and $B_S$ is the FWHM of the diffraction peak from the standard sample.

Transmission election micrographs were taken on Hitachi-8100 operating at 200 kV. Carbon-coated formvar grids (300 mesh, from Ted Pella) were used as substrates for TEM characterizations. Langmuir-Blodgett technique was used to prepare monolayers of PbS crystallites for TEM studies. A few drops of thiol capped PbS nanoparticles in chloroform were spread on the surface of deionized water. Patches of thin films formed on the surface of water, without the application of surface pressure, were transferred onto formvar coated copper grids.

The experimental setup for a qualitative comparison of the mobilities of lead cations and sulfide anions within cubic AOT system is shown in FIG. 2(*b*). Glass capillary (diameter=1.5 mm) 30 was filled with mixture 32 of AOT (78 wt %) and water (22 wt %) exhibiting BCP. Immediately after the upper part of hollow capillary 30 was filled up with 0.20 M $Na_2S$ solution 34 (no air between AOT mixture/$Na_2S$ interface), the lower end of capillary 30 was submerged into 0.10 M $Pb(NO_3)_2$ solution 36. After about 15 minutes, formation of PbS was observed over region 38 (2 mm long) close to the top part of the sample, where the sample turned to light brown color. The formation of PbS was observed always close to the $Na_2S$ end, for all concentrations of $Na_2S$ and $Pb(NO_3)_2$ studied.

The stability of the cubic phase during the formation of PbS was studied under a polarizing optical microscope. A thin section of BCP (~100 μm thick and 5 mm diameter) was sandwiched between a microscope slide and a coverslip. The free space around the sample was filled with $Pb(NO_3)_2$ solution, by capillary action. The changes in the appearance of the sample as the $Pb^{2+}$ ions diffused into it was observed periodically.

Phase diagram of AOT/$Na_2S$/water. The phase diagram of binary AOT/water system shows that the cubic phase exists in a narrow region (18–25 wt % AOT) between inverse hexagonal phase (water poor side) and lamellar phase (water rich side). From small angle x-ray scattering (SAXS) studies combined with polarized optical microscopy is was determined that the cubic phase (Ia3d) still existed in ternary AOT/$Na_2S$ /water system. Increasing $Na_2S$ concentration led to the narrowing and shifting of cubic region to water-rich side and eventual disappearance when $Na_2S$ concentration was higher than 0.5M. This phase behavior is schematically shown by the phase diagram in FIG. 3. The phase boundaries in FIG. 3 are only estimations rather than representing precise values. An interesting feature observed in the low-angle X-ray diffraction (not shown) obtained from mixture of AOT and $Na_2S$ exhibiting BCP was the presence of diffraction spots instead of the usually observed powder diffraction rings. This indicated that the structure of the cubic phase in the capillary was coherent over a very long range. The samples used for PbS synthesis should have similar long range order (since they were prepared in exactly the same fashion), thus allowing uniform diffusion of lead cations throughout the sample.

Figure 4:
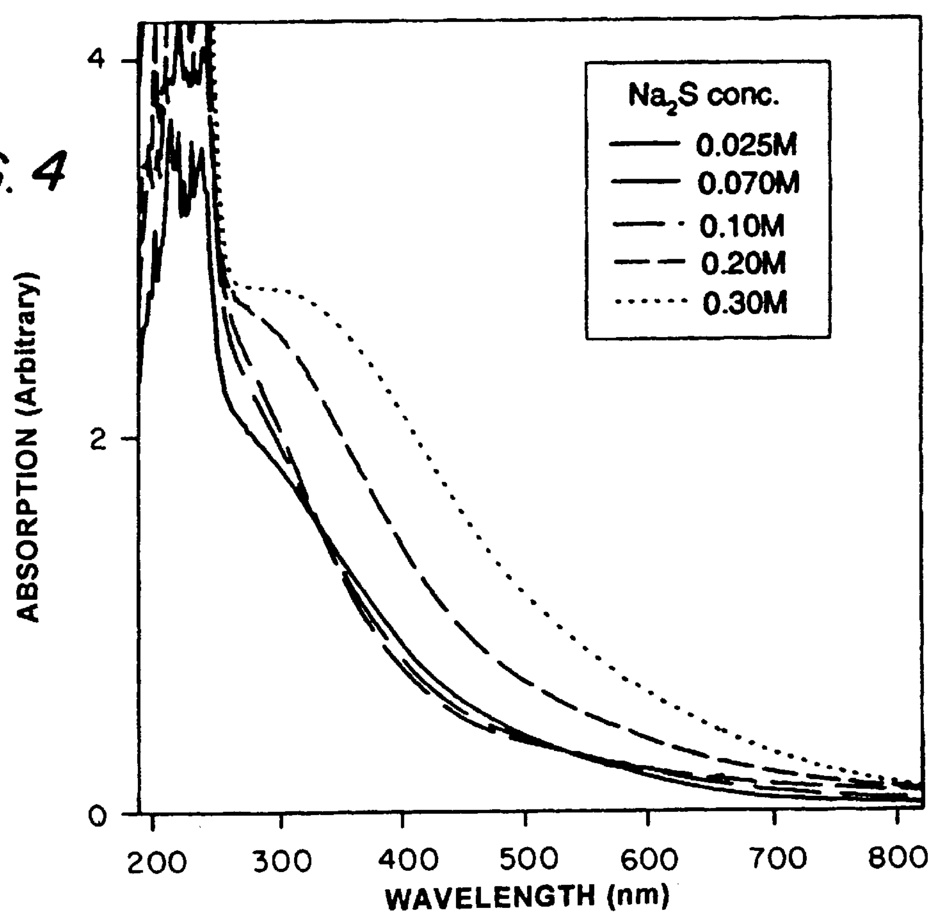
FIG. 4 shows the UV-visible absorption spectra of dodecanethiol-capped PbS nanocrystallites prepared through cubic AOT matrices starting with $Na_2S$ solution concentrations of 0.025M (————), 0.070M (—— ——), 0.10M (—— ——), 0.20M (- -), and 0.30M (••••••••••).

UV-Visible Absorption Spectra. The absorption spectra of n-dodecanethiol capped PbS particles prepared from different concentrations of sodium sulfide solution mixed with AOT is shown in FIG. 4. The absorption in the region under 260 nm is due to the solvent (chloroform). As the concentration of $Na_2S$ solution incorporated in AOT increased from 0.025 M to 0.10 M, the shapes of the absorption spectra in the region 260–800 nm were almost the same. However, when the concentration of $Na_2S$ was increased to 0.20 M, a small shoulder appeared at around 300 nm. This shoulder became more pronounced and red-shifted to longer wavelength when the concentration of $Na_2S$ increased to 0.30 M or higher, indicating an increase in the absorption edge with size. All these curves were featureless in contrast to prior art absorption spectra of PbS nanocrystallites prepared from $Pb(ClO_4)_2$ in polyvinyl alcohol polymer matrix, which exhibited an excitonic peak around 600 nm. Since the size distribution of PbS particles prepared from $Na_2S$ solution with concentrations lower than 0.20 M was quite narrow, it is probably the surface structure of the PbS nanocrystallites which is responsible for the lack of excitonic features.

Figure 5:
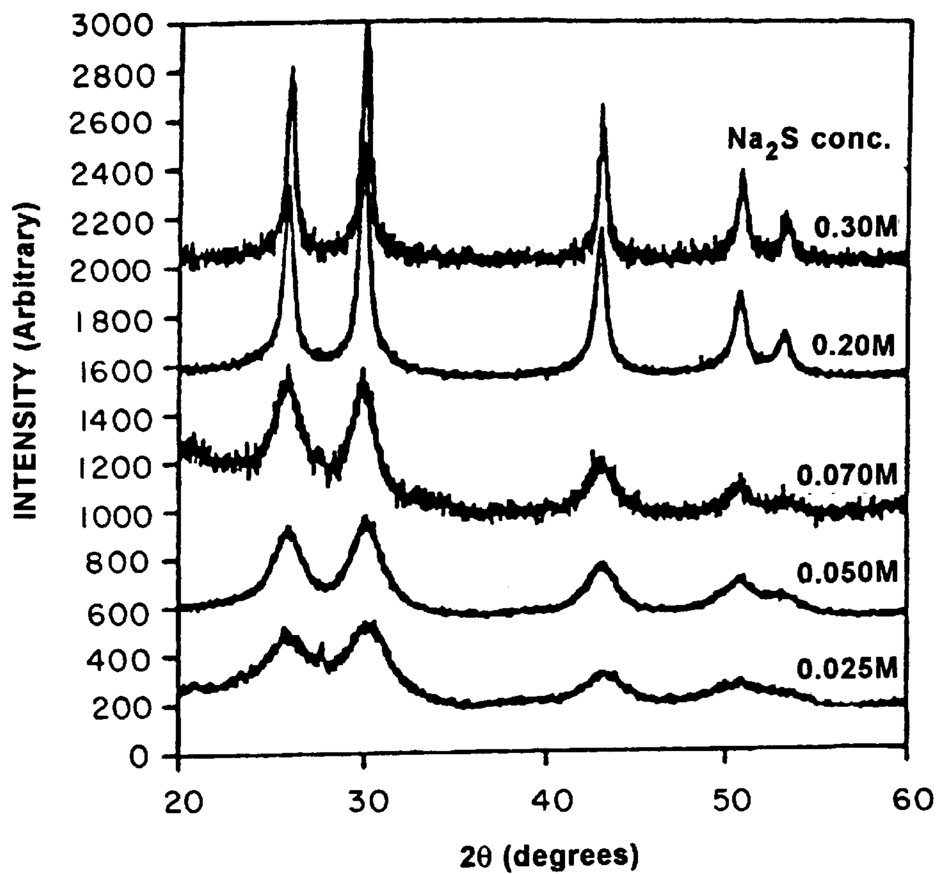
FIG. 5 shows x-ray diffraction scans of PbS nanoparticle samples prepared in the cubic phase of AOT from aqueous $Na_2$ solutions at the indicated concentrations.

X-ray Diffraction Experiments. X-ray diffraction (XRD) of lead sulfide nanoparticles prepared from the exposure of $Na_2S$ solution incorporated in cubic phase of AOT to 0.40 M $Pb(NO_3)_2$ solution have shown that the concentration of $Na_2S$ solution had great effect on the size of PbS nanocrystallites which can be seen from FIG. 5. All the observed diffraction peaks for all particle sizes can be indexed on the basis of rocksalt structure. As the concentration of $Na_2S$ decreased from 0.30 M to 0.025 M, the width of the diffraction peaks increased as a result of the decrease in the size of the nanocrystallites. The average sizes, which are listed in Table 1, were calculated from the half width of the {111} and {200} peaks using the Scherrer formula with the correction due to instrument broadening as mentioned in experimental section.

TABLE 1

The relationship between the concentration of aqueous $Na_2S$ solution in AOT forming cubic phase and the PbS nanocrystallites size, calculated from the width of {111} and {200} peaks of XRD experiments.

| $Na_2S$, M | av. diameter, nm |
|---|---|
| 0.025 | 4.0 |
| 0.050 | 4.7 |
| 0.070 | 5.8 |
| 0.10 | 6.6 |
| 0.20 | 8.2 |
| 0.30 | 13.5 |

Transmission Electron Microscopy. As shown by a transmission electron micrograph of lead sulfide nanocrystallites prepared from 0.050 M $Na_2S$ solution, the particles are slightly aspherical and tend to close pack into a quasi-hexagonal lattice. About half of the particles in the same micrograph gave sharp lattice fringes with most frequent spacings of 3.1 and 2.2 Å which correspond to (200) and (220) planes respectively. For particles which showed lattice fringes with good contrast, sizes could be measured by averaging the shorter and longer dimensions. The mean size obtained from the partial measurement in that micrograph was 4.9 nm±0.6 nm, which agrees very well with the size (4.7 nm) obtained from X-ray diffraction peaks (see Table 1). Precise measurement of particle size for about half of the particles was difficult due to poor contrast of the image. Therefore, the true standard deviation in the particle size may be better than that reported here. This is a significant improvement in the uniformity of size and morphology compared to that of PbS particles synthesized in polymer and sol-gel matrices, which yielded wide size distribution (50% deviation in the polymer) and various crystallite morphologies (both cubic and rod-like nanocrystallites were found when made by sol-gel method). The above-mentioned micrograph represented a typical appearance of the lead sulfide nanoparticulate samples prepared from $Na_2S$ solutions with concentration lower than 0.10M, except that the particle sizes decreased from 6 nm down to 4 nm as the concentration of $Na_2S$ dropped from 0.10 M to 0.025 M. When the concentration of $Na_2S$ solution was higher than 0.20 M, the particle size became much larger and a bimodal distribution in size was observed. A TEM micrograph of PbS particles prepared from 0.30 M $Na_2S$ within AOT matrix showed large particles with average size of about 25 nm and predominantly cubic morphology. In addition to these large particles, a large number of small particles (4–5 nm) with low contrast were visible A high resolution TEM image of PbS nanocrystallites prepared from 0.10M $Na_2S$ showed lattice fringes with either 3.0 Å or 2.2 Å spacing corresponding to the (200) or the (220) planes, respectively. The reason that many PbS nanoparticles in the same area gave (200) and (220) fringes might be due to the cubic morphology of the particles which enables the particles to sit on its (001) face. The examination of those particles which gave sharp lattice fringes did not reveal lattice defects such as stacking faults. The lattice fringes extend to the edges of the particles indicating good crystallinity.

Experiments conducted by reversing the process, i.e., forming BCP of AOT in $Pb(NO_3)_2$ solution and exposing to $Na_2S$ solution, resulted in the formation of PbS only on the outer surface of the cylinder. This result is in conformity with the mobility studies (see FIG. 2(*b*)), described in the experimental section, which showed that the $Pb^{2+}$ cations diffuse much faster than the $S^{2-}$ anions within cubic phase. This relative immobility of sulfide anions ($S^{2-}$) with respect to lead cations ($Pb^{2+}$) within the cubic structure ensures uniform environment throughout the sample for nucleation and crystallization of PbS as the $Pb^{2+}$ ions diffuse from the surface into the core of the extruded cylinder. Presuming the density of AOT in cubic phase to be 1.2 g/$cm^3$ based on the fact that AOT in cubic phase is heavier than water (sinking instead of floating), it can be calculated that each pore consists of about 200 AOT molecules. In the mixture of 22 wt % 0.10 M $Na_2S$ and 78 wt % AOT, the ratio between number of AOT molecules and number of sulfide ($S^{2-}$ ) is about 80:1, which means that each pore contains less than 3 sulfide anions. Thus, a probable process of PbS particle formation can be speculated as such: the infusion of large amount of $Pb^{2+}$ cations from the surrounding solution into the cylinder results in nucleation sites in some pores which subsequently attract sulfide anions from the pores in its vicinity leading to the growth of nanocrystallites. Another possibility which cannot be excluded is the simultaneous nucleation of PbS molecules and subsequent growth of the particles by Ostwald ripening.

Optical microscopic studies were carried out to ascertain that the substrate is in the cubic phase during the formation of PbS nanocrystallites. As mentioned earlier, BCP being optically isotropic, does not allow light to pass through when observed between crossed polarizers. However, in a slightly off-crossed state (obtained by rotating either the analyzer or the polarizer by a few degrees) a uniform orange color was observed along the periphery of the sample as soon as the $Pb(NO_3)_2$ solution was added. This reaction front moved into the sample at the rate of about 1–2 mm/hr. for all the samples. These studies enabled us to fix two experimental parameters during the synthesis of PbS nanoparticles. Firstly, it enabled us to ascertain that the BCP was maintained during the particle formation. Secondly, based on these observations, we could determine the period over which the substrate is exposed to $Pb(NO_3)_2$ solution. It should be mentioned here that for some combinations of $Na_2S$ and $Pb(NO_3)_2$ concentrations, it was observed that even though the reaction front was in the cubic phase, it left the substrate in the lamellar phase in its wake. It was found that as the difference in the concentrations of $Na_2S$ and $Pb(NO_3)_2$ solutions decreased, the lamellar phase region increased. This probably is the reason for the bimodal distribution observed for the 0.20 and 0.30 M concentrations of $Na_2S$.

Example 1A

Lead sulfide nanocrystals by alternate method according to the present invention The lead sulfide nanocrystals were also synthesized by first forming the cubic phase in a sulfide containing solution and then adding the one of the lead salt solutions. A mixture of surfactant (AOT) and sulfide containing solution (concentration variable 0.01–1M) was first prepared and then injected into lead compound solution in form of thin sheet or cylinder. After typically 1 hour, the solution was discarded by decantation. The viscous mixture was washed by deionized water followed by isolation process: dissolution in methanol, sonication and centrifuging at 4000 rpm rate. The obtained nanoparticles were purified by repeating dispersion in methanol, sonication and centrifuge cycle.

Example 2

Cadmium sulfide nanocrystals

Figure 6:
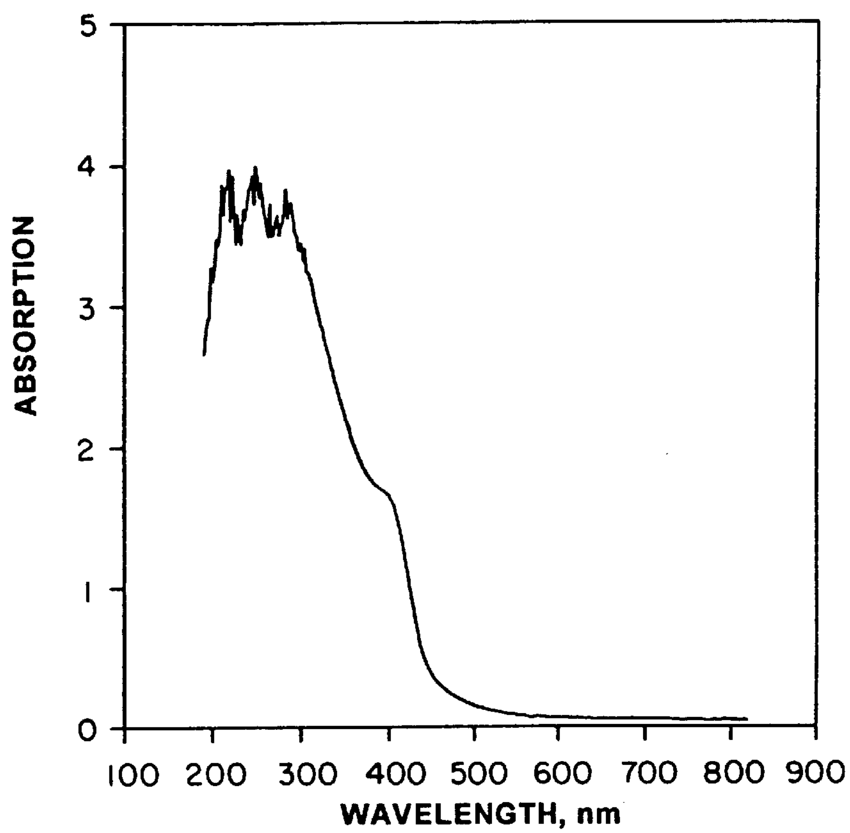
FIG. 6 shows the absorption spectrum of cadmium sulfide nanoparticles, obtained according to the present invention, dispersed in chloroform.

Cadmium sulfide nanoparticles were synthesized using one of the methods described in Example 1 and Example 1A, except the lead compound is replaced by cadmium compound (e.g. cadmium chloride, cadmium perchlorate, cadmium nitrate, eta.). FIG. 6 shows the absorption spectrum of obtained cadmium sulfide nanoparticles dispersed in chloroform.

Example 3 lead selenide nanocrystals

Lead selenide nanoparticles were synthesized by same methods and processing procedures used in example 1 except that the sulfide-containing solution was replaced by a selenide-containing solution that was prepared by bubbling dilute aqueous sodium hydroxide solution with hydrogen selenide gas.

Example 4

Mn-doped zinc sulfide nanocrystals

Figure 7:
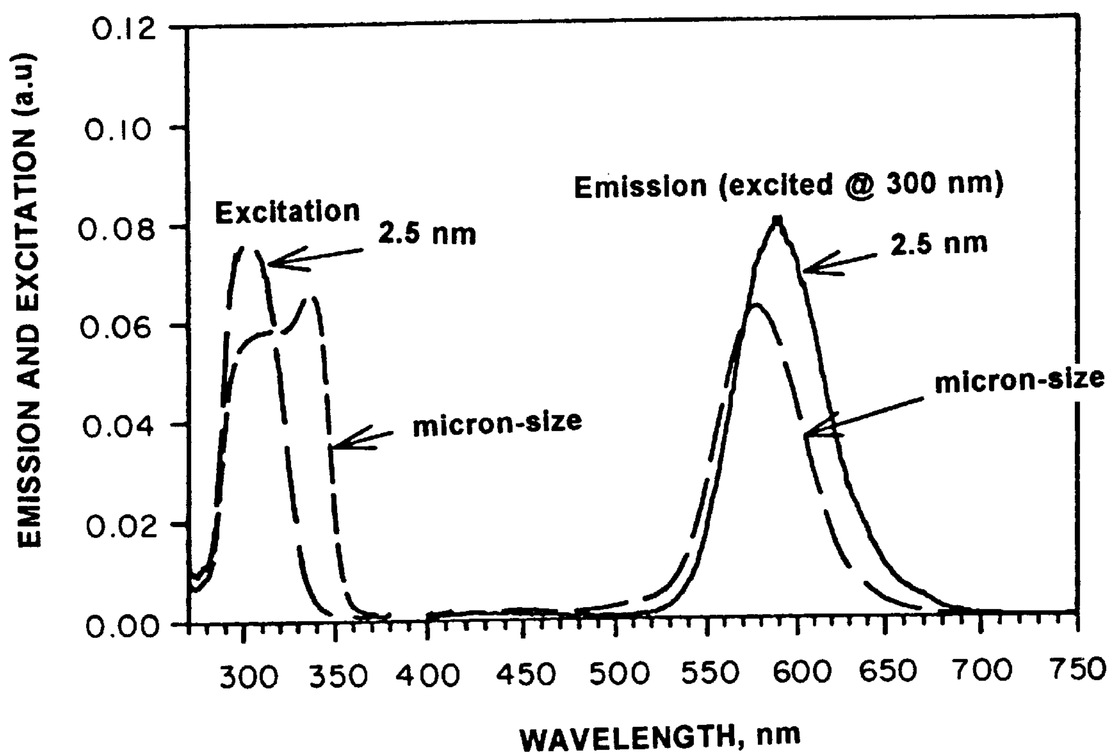
FIG. 7 shows the photoluminescence (excitation and emission spectra) of mercaptopropionic-acid-capped ZnS:Mn nanoparticles dispersed in water.

The synthesis was achieved by using the method used in EXAMPLE 1 except that the lead compound solution was replaced by a mixture of zinc chloride and trace amount manganese chloride (0.05–2%). When the surface of the Mn-doped ZnS particles was passivated and protected by thiol compounds, 25% of luminescent efficiency was achieved. FIG. 7 shows the photoluminescence (excitation and emission spectra) of mercaptopropionic-acid-capped ZnS:Mn nanoparticles dispersed in water. For comparison, the photoluminescence of micro-sized ZnS:Mn particulate sample is also shown.

Additional information concerning the present invention may be found in Yang et al., *J. Phys. Chem., Vol.* 100, No. 43, pages 17255–17259, the entirety of which is incorporated herein by reference.

Obviously, many modifications and variations of the present invention are possible in light of the above teachings. It is therefore to be understood that, within the scope of the appended claims, the invention may be practiced otherwise than as specifically described.

What is claimed is:

1. A method of producing monodispersed nanocrystalline semiconductor particles, said semiconductor particles comprising a compound formed as the reaction product of two or more reactants, comprising the steps of:

forming a bicontinuous cubic phase including interconnected mesoporous cavities, said mesoporous cavities housing at least one and less than all of said reactants from which said compound is formed, said bicontinuous cubic phase being nonreactive with respect to all of said reactants;

diffusing the remainder of said reactants into said mesoporous cavities;

allowing said reactants to react, within said mesoporous cavities, to form nanocrystalline semiconductor particles, said mesoporous cavities being of a diameter that limits the size of said nanocrystalline semiconductor particles formed therein to no greater than about 100 nm in diameter.

2. The method of claim 1, wherein said mesoporous cavities have a diameter of no more than about 100 nm.

3. The method of claim 1, wherein said compound is a binary compound.

4. The method of claim 1, wherein said compound is formed by the reaction of no more than two reactants.

5. The method of claim 1, wherein said bicontinuous cubic phase is formed by mixing a surfactant with an aqueous phase in a ratio effective to form said bicontinuous cubic phase, and wherein at least one of said surfactant and said aqueous phase includes, before mixing, said one of said reactants.

6. The method of claim 5, wherein said at least one of said aqueous phase includes said one of said reactants.

7. The method of claim 6, wherein said surfactant is a lipid.

8. The method of claim 7, wherein said mesoporous cavities of said bicontinuous cubic phase are bounded by surfactant bilayers.

9. The method of claim 7, wherein said mesoporous cavities of said bicontinuous cubic phase have diameters of no greater than about 10 nm.

10. The method of claim 9, wherein said mesoporous cavities of said bicontinuous cubic phase have diameters of about 2–10 nm.

11. The method of claim 1,, wherein said compound is a IV–VI semiconductor.

12. The method of claim 1, wherein said all of said reactants are ions in solution.

13. The method of claim 1, wherein one of said mesoporous cavities include a dopant ion during the reaction of said reactants, so that said reactants form a doped semiconductor compound.

14. The method of claim 1, further comprising the steps of:

recovering said nanocrystalline semiconductor particles by dissolving said bicontinuous cubic phase in a solvent in which said nanocrystalline semiconductor particles are insoluble.

15. The method of claim 14, further comprising the step of washing said recovered nanocrystalline semiconductor particles in a solution of an antiagglomeration agent that attaches to said particles.

16. The method of claim 15, wherein said antiagglomeration agent is Y—R—SH, where R is a hydrocarbon carbon chain of at least two carbons and Y is a hydrophobic or hydrophilic end group.

17. The method of claim 16, wherein Y is selected from the group consisting of alkyl groups, —COOH, —OH, —SH and

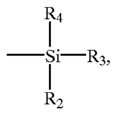

and wherein $R_2$, $R_3$, and $R_4$ may be the same or different and are selected from the group consisting of ethyl and methyl.

18. A method of producing monodispersed nanocrystalline semiconductor particles, said semiconductor particles comprising a compound formed as the reaction product of two or more reactants, comprising the steps of:

forming a bicontinuous cubic phase including interconnected mesoporous cavities, said mesoporous cavities housing all of said reactants from which said compound is formed, said bicontinuous cubic phase being nonreactive with respect to all of said reactants;

allowing said reactants to react, within said mesoporous cavities, to form nanocrystalline semiconductor particles, said mesoporous cavities being of a diameter that limits the size of said nanocrystalline semiconductor particles formed therein to no greater than about 100 nm in diameter.

19. A method of producing monodispersed nanocrystalline semiconductor particles, said semiconductor particles comprising a compound formed as the reaction product of two or more reactants, comprising the step of reacting all of said reactants, within mesoporous cavities of a bicontinuous cubic phase, to form monodispersed nanocrystalline semiconductor particles, said mesoporous cavities being of a diameter that limits the size of said nanocrystalline semiconductor particles formed therein to no greater than about 100 nm in diameter, said bicontinuous cubic phase being nonreactive with respect to all of said reactants.

* * * * *

UNITED STATES PATENT AND TRADEMARK OFFICE

CERTIFICATE OF CORRECTION

PATENT NO. : 6,106,609
DATED : August 22, 2000
INVENTOR(S) : Yang et al.

It is certified that error appears in the above-identified patent and that said Letters Patent is hereby corrected as shown below:

Title page,
Item [75], insert:

-- Syed B. Qadri, Fairfax Station, VA
David S. Y. Hsu, Alexandria, VA
Henry F. Gray (deceased), Alexandria, VA --

Signed and Sealed this

Twenty-third Day of October, 2001

Attest:

*Nicholas P. Godici*

NICHOLAS P. GODICI

*Attesting Officer* *Acting Director of the United States Patent and Trademark Office*